United States Patent
Park et al.

(10) Patent No.: US 7,522,226 B2
(45) Date of Patent: Apr. 21, 2009

(54) LIQUID CRYSTAL DISPLAY

(75) Inventors: Hyeong-jun Park, Cheonan-si (KR); Kyung-wook Kim, Seoul (KR); Byeong-jae Ahn, Seoul (KR); Bong-jun Lee, Seoul (KR); Yeon-kyu Moon, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 426 days.

(21) Appl. No.: 11/502,670

(22) Filed: Aug. 11, 2006

(65) Prior Publication Data

US 2007/0034879 A1 Feb. 15, 2007

(30) Foreign Application Priority Data

Aug. 12, 2005 (KR) .............. 10-2005-0074454

(51) Int. Cl.
*G02F 1/136* (2006.01)
*H01L 29/04* (2006.01)
(52) U.S. Cl. .............. 349/43; 349/42; 349/46; 349/84; 349/106; 349/139; 257/72
(58) Field of Classification Search .......... 349/43, 349/42, 54, 73, 74, 84, 139, 140, 141, 144, 349/147, 149, 158, 153, 46, 106; 257/72
See application file for complete search history.

(56) References Cited

U.S. PATENT DOCUMENTS

| | | | | |
|---|---|---|---|---|
| 6,642,580 | B1* | 11/2003 | Yun | 257/350 |
| 7,088,323 | B2* | 8/2006 | Yeo et al. | 345/87 |
| 2002/0080317 | A1* | 6/2002 | Yeo et al. | 349/149 |
| 2006/0232739 | A1* | 10/2006 | Yeo et al. | 349/149 |
| 2007/0034879 | A1* | 2/2007 | Park et al. | 257/72 |
| 2008/0042133 | A1* | 2/2008 | Chin et al. | 257/59 |

* cited by examiner

*Primary Examiner*—Brian M Healy
(74) *Attorney, Agent, or Firm*—Cantor Colburn LLP

(57) ABSTRACT

A liquid crystal display ("LCD") includes a data interconnection line including a data line, a source electrode as a branch of the data line, and a drain electrode formed spaced apart from the source electrode, a semiconductor layer formed under the data interconnection line and connected to the source electrode and the drain electrode below the source electrode and the drain electrode and forming a channel region, and a gate interconnection line formed under the semiconductor layer and including a gate line intersecting the data line, the gate line extending in a first direction and the data line extending in a second direction, and a gate electrode branched from the gate line, wherein the gate line includes a first recess having a first width and a first length.

22 Claims, 10 Drawing Sheets

LIQUID CRYSTAL DISPLAY

This application claims priority to Korean Patent Application No. 10-2005-0074454, filed on Aug. 12, 2005 and all the benefits accruing therefrom under 35 U.S.C. §119, and the contents of which in its entirety are herein incorporated by reference.

BACKGROUND OF THE INVENTION

1. Field of the Invention

The present invention relates to a liquid crystal display ("LCD"). More particularly, the present invention relates to enhancing luminance of an LCD.

2. Description of the Related Art

In general, an LCD includes an upper substrate and a lower substrate, and a liquid crystal material interposed therebetween. The upper and lower substrates are adhered to each other by a sealant provided at peripheries thereof and enclosing the liquid crystal material, and are supported by a spacer disposed between the upper and lower substrates.

In such LCDs, liquid crystal materials with dielectric anisotropy are included in the liquid crystal layer adjacent electrodes on the upper and lower substrates so that an electric field is generated between the electrodes and the interposed liquid crystal materials, and the electric field strengths are adjusted to control the transmittance of light passing through the substrates, thereby displaying an image.

Liquid crystal panels of conventional LCDs include a plurality of pixels connected to a plurality of gate lines and a plurality of data lines. Each pixel includes a TFT connected to the plurality of gate lines and the plurality of data lines and a storage capacitor (Cst) and a liquid crystal capacitor (Clc) connected to the TFT. The storage capacitor includes a storage electrode formed during a same manufacturing operation as when a gate electrode of the TFT is formed. A gate insulating layer and a pixel electrode are then formed on the storage electrode.

In order to form the storage electrode simultaneously when the gate electrode of the TFT is formed, the critical dimension ("CD") of a gate interconnection line should be increased and the aperture ratio of an LCD should be reduced.

BRIEF SUMMARY OF THE INVENTION

The present invention provides a liquid crystal display ("LCD") capable of improving an aperture ratio to enhance the luminance of the LCD.

The above and other features and advantages of the present invention will become clear to those skilled in the art upon review of the following description.

According to exemplary embodiments of the present invention, there is provided a liquid crystal display (LCD) comprising a first panel comprising an insulating substrate, a gate interconnection line formed on the insulating substrate and including a gate line and the gate electrode branched from the gate line, the gate line extending in a first direction, a data interconnection line including a data line, a source electrode as a branch of the data line, and a drain electrode formed spaced apart from the source electrode, the data line electrode extending in a second direction to intersect the gate line, a semiconductor layer formed on the gate electrode and having a channel region between the source electrode and the drain electrode and a pixel electrode formed for a pixel region defined by the gate interconnection line and the data interconnection line, a second panel facing the first panel and a liquid crystal layer interposed between the first and second panels, wherein the gate line includes a first recess having a first length in the first direction and a first width extending in the second direction.

BRIEF DESCRIPTION OF THE DRAWINGS

The above and other features and advantages of the present invention will become more apparent by describing exemplary embodiments thereof with reference to the attached drawings in which:

FIGS. 6B through 8 are sectional views showing exemplary processing steps, taken along line VIB'-VIB" of FIG. 6A;

DETAILED DESCRIPTION OF THE INVENTION

The present invention will now be described more fully with reference to the accompanying drawings, in which preferred embodiments of this invention are shown. Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a seconds element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The present invention will now be described more fully with reference to the accompanying drawings, in which exemplary embodiments of the invention are shown.

Figure 1:
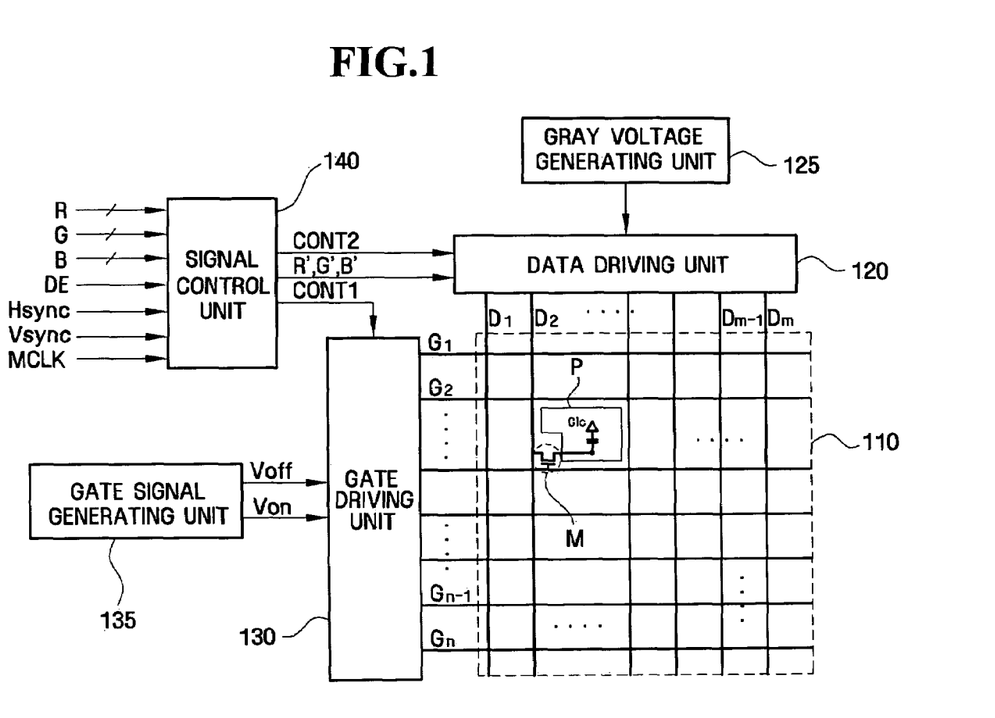
FIG. 1 is a schematic block diagram of an exemplary liquid crystal display ("LCD") according to an exemplary embodiment of the present invention.

FIG. 1 is a schematic block diagram of an exemplary liquid crystal display ("LCD") according to an exemplary embodiment of the present invention.

As shown in FIG. 1, an LCD includes a liquid crystal panel 110, a data driving unit 120, a gray voltage generating unit 125, a gate driving unit 130, a gate signal generating unit 135, and a signal control unit 140.

The liquid crystal panel 110 includes a plurality of pixels P connected to a plurality of gate lines G1 through Gn and a plurality of data lines D1 through Dm, and thus the pixels P are arranged in a matrix configuration. Each pixel P includes a switching device M connected to the plurality of gate lines G1 through Gn and the plurality of data lines D1 through Dm and a liquid crystal capacitor Clc connected to the switching device M. In the exemplary embodiment of the present invention, since no storage capacitor is used, the aperture ratio of the liquid crystal panel 110 can be increased, as will be further described below. Hereinafter, the terms thin film transistor ("TFT") and switching device are interchangeably used.

Each of the plurality of gate lines G1 through Gn formed in a row direction, a first direction, transmits a gate signal from the gate driving unit 130 to each switching device M and each of the plurality of data lines D1 through D1 formed in a column direction, a second direction substantially perpendicular to the first direction, transmits a gray voltage corresponding to a data signal to the switching device M. Each switching device M is a three-terminal device including a control terminal, such as a gate electrode, connected to the gate lines G1 through Gn, an input terminal, such as a source electrode, connected to the data lines D1 through D1, and an output terminal, such as a drain electrode, connected to a pixel electrode 92 (see FIG. 2) to form one terminal of the liquid crystal capacitor Clc. The liquid crystal capacitor Clc is connected between the output terminal of the switching device M and a common electrode (not shown) that may be located on an upper substrate (not shown) of the liquid crystal panel 110.

The gate driving unit 130 is connected to the plurality of gate lines G1 through Gn and provides the plurality of gate lines G1 through Gn with gate signals that activate the respective switching devices M. The data driving unit 120 is connected to the plurality of data lines D1 through D1. Here, the switching device M may be, but is not limited to, a metal oxide semiconductor ("MOS") transistor implemented as a TFT having a polysilicon channel region. The gate driving unit 130 and the data driving unit 120 may also include MOS transistors.

In general, a common electrode and a color filter are formed on a substrate opposed to a substrate where a TFT is formed. The liquid crystal panel 110 is formed by injecting liquid crystal between the two substrates.

As will be further described below, the switching device M or TFT includes a gate electrode, a source electrode, a drain electrode, a semiconductor layer, and an ohmic contact layer and the drain electrode is connected to a pixel electrode, thereby forming a unit pixel P. Once a gate signal is applied to the gate electrode through a gate line, a data signal applied to a data line is transmitted to the drain electrode from the source electrode via the ohmic contact layer and the semiconductor layer, thereby operating the TFT.

In other words, when the data signal is applied to the source electrode, a corresponding voltage is applied to the pixel electrode connected to the drain electrode, causing a voltage difference between the pixel electrode and the common electrode. The voltage difference between the pixel electrode and the common electrode changes the molecular arrangement of the liquid crystal interposed between the pixel electrode and the common electrode. The change in the molecular arrangement of the liquid crystal leads to a change in the amount of light transmission of a pixel. As a result, a difference between data signals applied to pixels causes a difference between colors of the pixels. The screen of an LCD can be controlled using such a color difference.

The data signal applied to the source electrode is provided from the data driving unit 120 and the gate signal applied to the gate electrode is provided from the gate driving unit 130.

The gate driving unit 130 sequentially provides a gate signal Von for activating the gate electrode or a gate signal Voff for deactivating the gate electrode to the plurality of gate lines G1 through Gn. The data driving unit 120 provides a gray voltage corresponding to the data signal to the plurality of data lines D1 through D1 according to timing when the gate signal is applied. Synchronization between the data driving unit 120 and the gate driving unit 130 is performed by the signal control unit 140.

More specifically, the signal control unit 140 receives image signals of, for example, red, green and blue (R, G, and B) and control signals for controlling the display of the image signals R, G, and B, such as a vertical synchronization signal Vsync, a horizontal synchronization signal Hsync, a main clock MCLK, and a data enable signal DE. Alternatively, the signal control unit 140 generates a gate control signal CONT1 and a data control signal CONT2 based on an input control signal and appropriately processes the image signals R, G, and B according to the operating conditions of the liquid crystal panel 110. Next, the signal control unit 140 provides the data control signal CONT2 to the gate driving unit 130 and the processed image signals R', G', and B' to the data driving unit 120.

The gate control signal CONT1 may include a vertical synchronization start signal STV for indicating the start of the output of a gate-on pulse, a gate clock signal CPV for controlling the output timing of the gate-on pulse, and an output enable signal OE for limiting the width of the gate-on pulse.

The data control signal CONT2 may include a horizontal synchronization start signal STH for indicating the start of the input of the image signals R', G', and B', a load signal LOAD for applying a corresponding data voltage to a data line, a reverse signal RVS for reversing the polarity of a data voltage corresponding to a common voltage Vcom, and a data clock signal HCLK.

The gray voltage generating unit 125 generates a pair of pluralities of gray voltages associated with the transmission rate of a pixel P. One of the pair is positive with respect to the common voltage Vcom and the other is negative with respect to the common voltage Vcom. Here, the common voltage Vcom is a voltage applied to the common electrode formed on the entire surface, or substantially the entire surface, of the upper substrate of the liquid crystal panel 110.

The data driving unit 120 sequentially receives and shifts the image signals R', G', and B' corresponding to pixels P in a row according to the data control signal CONT2 from the signal control unit 140 and selects a gray voltage corresponding to each of the image signals R', G', and B' from gray voltages of the gray voltage generating unit 125 to convert the image signals R', G', and B' to corresponding voltages and to apply the voltages to the data lines D1 through Dm.

The gate signal generating unit 135 generates a gate-on voltage Von and a gate-off voltage Voff applies the generated gate-on voltage Von and the gate-off voltage Voff to the gate driving unit 130.

The gate driving unit 130 applies the gate-on voltage Von to a gate line of the gate lines G1 through Gn according to the gate control signal CONT1 received from the signal control unit 140 to turn on the switching device M connected to the gate line of the gate lines G1 through Gn. The data voltage is then applied to a pixel P through the turned on switching device M.

A difference between the common voltage Vcom and a data voltage applied to each pixel P is expressed as a charge voltage of the liquid crystal capacitor Clc, i.e., a pixel voltage. Liquid crystal molecules are arranged differently according to the size of the pixel voltage. The change in the arrangement of the liquid crystal molecules changes the polarization of light penetrating through a liquid crystal layer. The change in the polarization leads to a change in the transmission rate of light by a polarizing plate (not shown) attached to the liquid crystal panel 110, allowing the display of desired image information.

Figure 2:
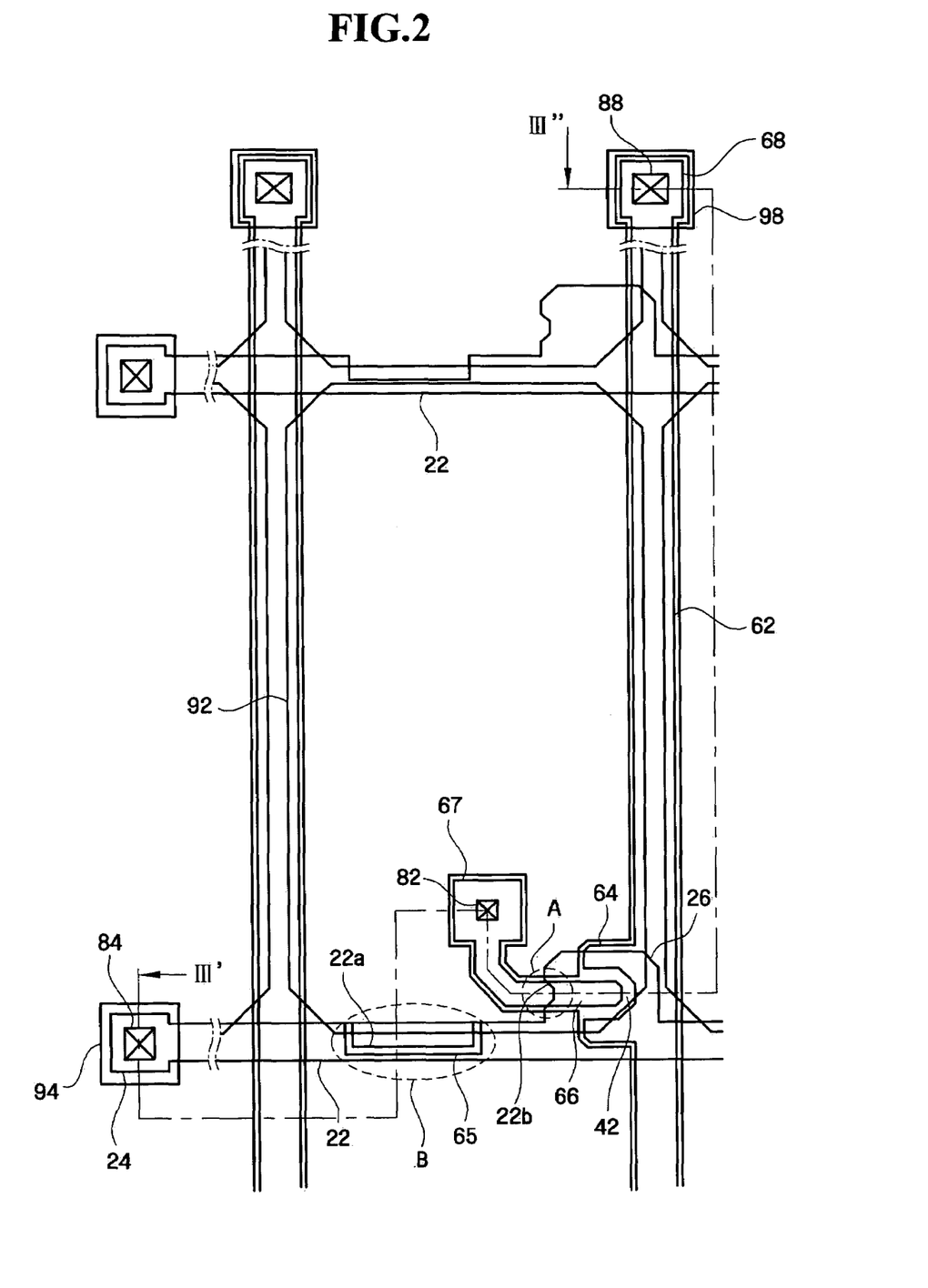
FIG. 2 is a circuit view of an exemplary thin film transistor ("TFT") panel fabricated by an exemplary method for fabricating a TFT panel according to an exemplary embodiment of the present invention.
Figure 3:
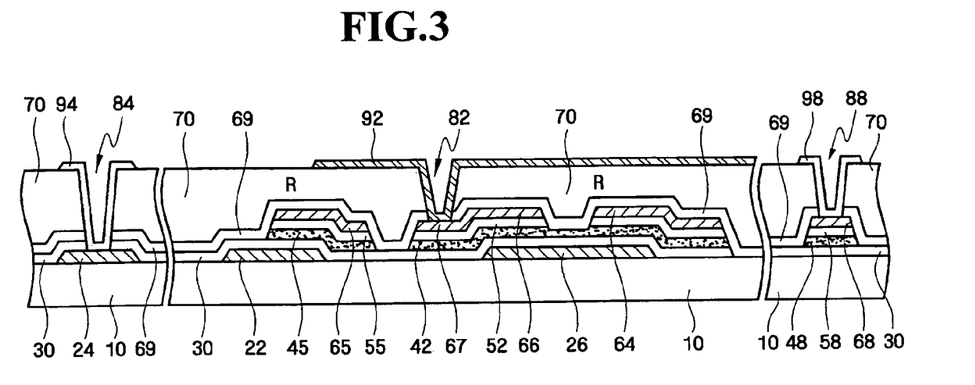
FIG. 3 is a sectional view taken along line III'-III" of FIG. 2.
Figure 4:
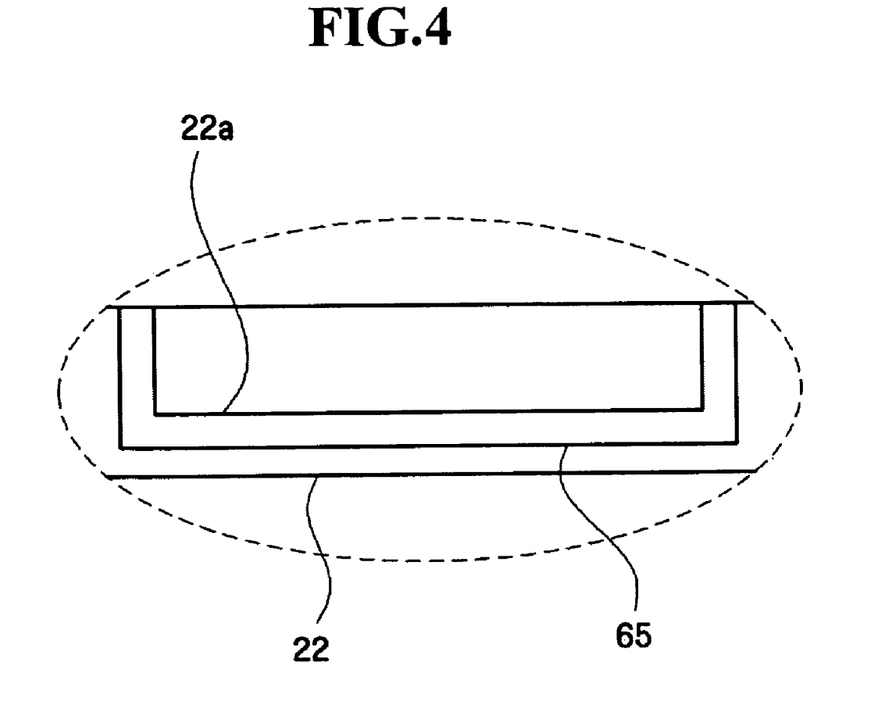
FIG. 4 is an exploded view of portion A of FIG. 2.
Figure 5:
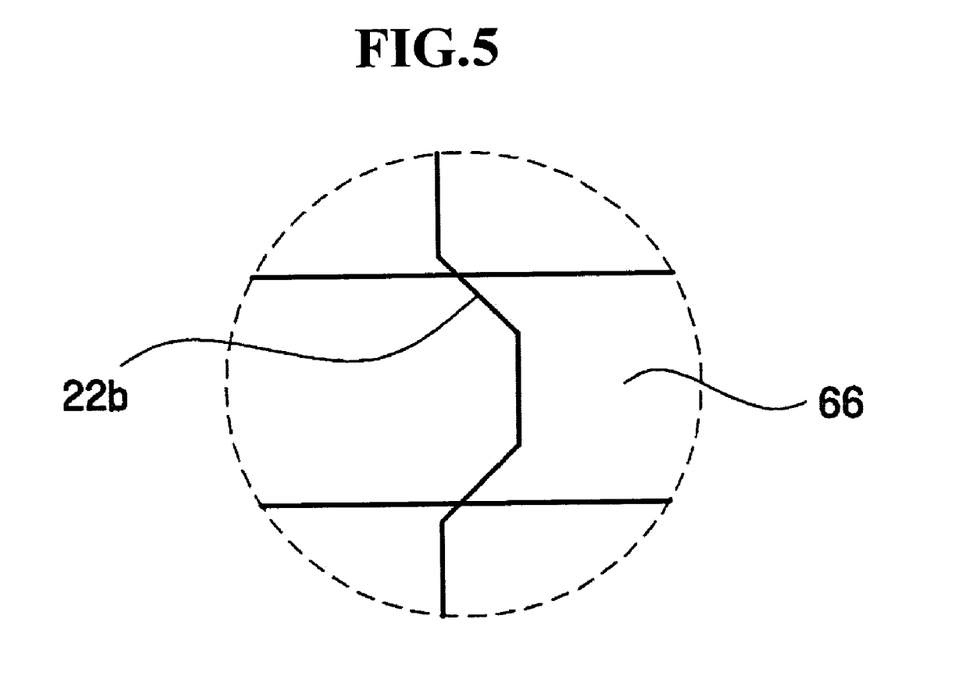
FIG. 5 is an exploded view of portion B of FIG. 2.

FIG. 2 is a circuit view of an exemplary TFT panel fabricated by an exemplary method for fabricating a TFT panel according to an exemplary embodiment of the present invention, FIG. 3 is a sectional view taken along line III'-III" of FIG. 2, FIG. 4 is an exploded view of portion A of FIG. 2, and FIG. 5 is an exploded view of portion B of FIG. 2.

As shown in FIG. 2, a gate line 22 is formed in a row direction, the first direction, on an insulating substrate 10 and a protruding gate electrode 26 is formed on the gate line 22. A gate line pad 24 is formed at an end of the gate line 22 to receive a gate signal from other layers or the outside, such as from a gate driving unit, and transmit the received gate signal to the gate line 22. The width of the gate line pad 24 is expanded to be connected to an external circuit. The gate line 22, the gate electrode 26, and the gate line pad 24 together constitute a gate interconnection line.

The gate interconnection line 22, 24, 26 is preferably made of an aluminum Al containing metal such as Al and Al alloy, a silver Ag containing metal such as Ag and Ag alloy, a copper Cu containing metal such as Cu and Cu alloy, a molybdenum Mo containing metal such as Mo and Mo alloy, chromium Cr, titanium Ti, or tantalum Ta.

In an exemplary embodiment, the gate interconnection line 22, 24, 26 may have a multi-layered structure including two conductive films (not shown) having different physical characteristics. In such a multi-layered structure, one of the two films is preferably made of a low resistivity metal including Al containing metal, Ag containing metal, and Cu containing metal for reducing signal delay or voltage drop in the gate interconnection line 22, 24, 26, and the other film is preferably made of material such as a Mo containing metal, Cr, Ta or Ti, which have good physical, chemical, and electrical contact characteristics with other materials such as indium tin oxide ("ITO") or indium zinc oxide ("IZO"). Examples of combinations of the two films include a lower Cr film and an upper Al (alloy) film and a lower Al (alloy) film and an upper Mo (alloy) film. While particular exemplary embodiments are described, it should be understood that the gate interconnection line 22, 24, 26 may be made of various metals or conductors.

In the present invention, as shown in FIG. 1, a storage electrode line extending in parallel to the gate line 22 and including a storage electrode connected to a TFT in parallel is not formed. By not including such a storage electrode, the aperture ratio of the LCD is increased and the critical dimension ("CD") of a gate interconnection line is reduced. However, since the storage electrode is not formed, a parasitic capacitance Cgs between a gate electrode and a source electrode of the TFT increases, resulting in an increase in a kickback voltage. At this time, when the potential of a gate voltage Vg of the TFT for driving a liquid crystal is switched from the gate voltage Von to the gate voltage Voff, a gray voltage Vp is reduced by a specific potential. The kickback voltage means the specific potential Vkb and can be expressed as follows:

$$Vkb = \frac{Cgs}{Cgs + Clc + Cst} \Delta(Von - Voff) \qquad (1)$$

As can be seen from Equation 1, the kickback voltage Vkb can be reduced by reducing the parasitic capacitance Cgs between a gate electrode and a source electrode. Thus, in exemplary embodiments of the present invention, as shown in FIGS. 2, 4, and 5, a first recess 22a having a first width and a first length, and a second recess 22b having a second width are formed on the gate line 22 and the gate electrode 26, respectively. An end portion of the second recess 22b is formed in such a way to be aligned with an end portion of a channel region formed under a drain electrode 66, as will be further described below. The first width of the first recess 22a is in a range of 9-11 μm and the second width of the second recess 22b is in a range of 3-5 μm.

To prevent light leakage from occurring due to the first recess 22a, a light blocking layer 65 is formed on the gate line 22 in such a way to cover the first recess 22a. It is preferable that the length of the first recess 22a be in a range of 30-70% of the width of a pixel region, where the width of the pixel region is measured between a pair of adjacent data lines 62 flanking the pixel region. The light blocking layer 65 is formed of the same material and to the same thickness as a source electrode 64 and the drain electrode 66, and may thus be formed within a same manufacturing process. The light blocking layer 65 is formed in the shape of an island, since it is only needed to prevent light leakage, and has a floating state in which a voltage is not applied. The light blocking layer 65 may also have a width of approximately 30-70% of that of a pixel region.

A gate insulating layer 30 is formed on the gate interconnection line 22, 24, 26 and on exposed surfaces of the insulating substrate 10. A semiconductor layer 42 made of hydrogenated amorphous silicon ("a-Si") or polycrystalline silicon is formed on the gate insulating layer 30. The semiconductor layer 42 may have various shapes such as island shapes or line shapes. In the illustrative embodiment, for example, the semiconductor layers 42 may be formed in a line shape. When the semiconductor layer 42 is formed in a line shape, it may be disposed under the data line 62 and extend upward across the gate electrode 26. Portions 45 and 48 of the semiconductor material used for forming the semiconductor layer 42 may remain under the light blocking layer 65 and under a data line pad 68 of the data line 62, respectively.

Ohmic contact layers 52 and 55 made using a material such as, but not limited to, silicide or n+ hydrogenated a-Si doped with n-type impurities at high concentration are formed on the semiconductor layer 42 and the portion 45, respectively. Here, the ohmic contact layers 52 may be formed in a shape of an island or line and positioned below the drain electrode 66 and the source electrode 64. When the ohmic contact layers 52 are formed in a line shape, they extend below the data line 62 and extend to below the data line pad 68 at a portion 58 of the ohmic contact material overlying portion 48 of the semiconductor material.

The data line 62 extends in a longitudinal direction, the second direction substantially perpendicular to the first direction, and intersects the gate line 22, while the source electrode 64 extends over the ohmic contact layer 52 as a branch of the data line 62. A data line pad 68, which receives data signals from another layer or from an external circuit, such as from a data driving unit, and transmits the data signals to the data line 62, is formed at one end of the data line 62. The drain electrode 66 is separate from the source electrode 64, and also overlies a portion of the ohmic contact layer 52. The drain electrode 66 and the source electrode 64 are separate from each other and are located on the opposite sides of the gate electrode 26 or a channel portion of the TFT formed between the drain electrode 66 and the source electrode 64 and between opposing portions of the ohmic contact layer 52. The channel portion of the TFT is thus formed on an exposed portion of the semiconductor layer 42. The data line 62, the data line pad 68, and the source electrode 64 constitute a data interconnection line. The data interconnection line may also be considered to encompass the drain electrode 66.

Here, the data line 62 is repeatedly formed at an interval corresponding to a length of a pixel. A portion of the data line 62 extending in a longitudinal direction is connected to the source electrode 64 and intersects the gate line 22.

The data line 62 and the source electrode 64 and the drain electrode 66 are preferably made of refractory metal such as Cr, Mo, Ti, Ta or alloys thereof. In an exemplary embodiment, the data line 62 and the source electrode 64 and the drain electrode 66 may have a multilayered structure including a low-resistivity film (not shown) and a good-contact film (not shown). Examples of the multi-layered structure include a double-layered structure having a lower Cr film and an upper Al (alloy) film, a double-layered structure having a lower Al (alloy) film and an upper Mo (alloy) film, and a triple-layered structure having a lower Mo film, an intermediate Al film, and an upper Mo film. While particular exemplary embodiments are described, it should be understood that the data interconnection line 62, 64, 68 and the drain electrode 66 may be made of various metals or conductors.

The source electrode 64 overlaps with at least a portion of the semiconductor layer 42. The drain electrode 66 is opposite to the source electrode 64 in view of the gate electrode 26 and also overlaps with at least a portion of the semiconductor layer 42. Here, the ohmic contact layer 52 is interposed between the semiconductor layer 42 and the source electrode 64 and between the semiconductor layer 42 and the drain electrode 66 to reduce a contact resistance.

The drain electrode 66 includes a bar-type end overlapping with the semiconductor layer 42 and a drain electrode extension portion 67 having a wider area extending from the bar-type end. The bar-type end of the drain electrode 66 overlaps the second recess 22b formed in the gate electrode 26.

A passivation layer 69 is formed on the data line 62, the drain electrode 66, and an exposed portion of the semiconductor layer 42, as well as on exposed portions of the gate insulating layer 30. Here, the passivation layer 69 is preferably made of an inorganic insulator such as silicon nitride or silicon oxide, or a low dielectric insulating material such as a-Si:C:O and a-Si:O:F formed by plasma enhanced chemical vapor deposition ("PECVD").

A dielectric layer 70 is formed on the passivation layer 69. Here, the dielectric layer 70 may be made of an organic layer and photosensitive color resin of R, G and B. Contact holes 82 and 88 are formed in the color filter layer 70 and through the passivation layer 69 in such a way to expose the drain electrode extension portion 67 and the data line pad 68. A contact hole 84 is formed in the color filter layer 70, the passivation layer 69, and the gate insulating layer 30 in such a way to expose the gate line pad 24. A pixel electrode 92 is formed on the color filter layer 70 and through the passivation layer 69 in such a way to be electrically connected to the drain electrode 66 through the contact hole 82 via the drain electrode extension portion 67. At this time, the boundary of the pixel electrode 92 may be located with respect to a projection of the data line 62.

The pixel electrode 92 is physically and electrically connected with the drain electrode extension portion 67 through the contact hole 82 and receives a data voltage from the drain electrode 66.

The pixel electrode 92 to which the data voltage is applied generates an electric field with a common electrode (not shown) of an upper panel (not shown) to which a common voltage is applied, so that liquid crystal molecules of a liquid crystal layer between the pixel electrode 92 and the common electrode are rearranged.

In addition, an auxiliary gate line pad 94 and an auxiliary data line pad 98 are formed on the color filter layer 70 in such a way to be connected to the gate line pad 24 and the data line pad 68 through the contact holes 84 and 88, respectively. Here, the pixel electrode 92, the auxiliary gate line pad 94, and the auxiliary data line pad 98 are made of a transparent conductive material such as, but not limited to, ITO or IZO or a reflective conductive layer such as, but not limited to, aluminum. The auxiliary gate line pad 94 and the auxiliary data line pad 98 supplement and protect adhesion between the gate line pad 24 and the data line pad 68 and an external device such as a driving circuit and are not essential but optional.

An alignment layer (not shown) may be coated on the pixel electrode 92, the auxiliary gate line pad 94, the data line pad 98, and exposed portions of the color filter layer 70 to align a liquid crystal layer (not shown).

As shown in Equation 1, a liquid crystal having a high dielectric constant may be used to reduce a kickback voltage. For example, a liquid crystal having a dielectric constant of 3-5 in a normally white mode or a liquid crystal having a dielectric constant of 13-15 in a normally black mode may be used.

An LCD having a TFT and a color filter on a substrate is called an LCD having a color filter on array ("COA") structure. The COA structure may reduce an influence of the LCD caused by an assembly miss between the TFT and the color filter.

Here, although not shown in figures, a common electrode (not shown) made of a transparent material is formed on an upper substrate corresponding to a TFT panel and a black matrix pattern except for a color filter layer is formed or is not formed on the common electrode, thereby forming an LCD having a high aperture ratio. Alternatively, the black matrix pattern may be formed on the TFT panel together with the color filter layer, thereby forming only a common electrode on the upper substrate.

Next, an exemplary method for fabricating an exemplary TFT panel for an exemplary LCD according to an exemplary embodiment of the present invention will be described.

Figure 6A:
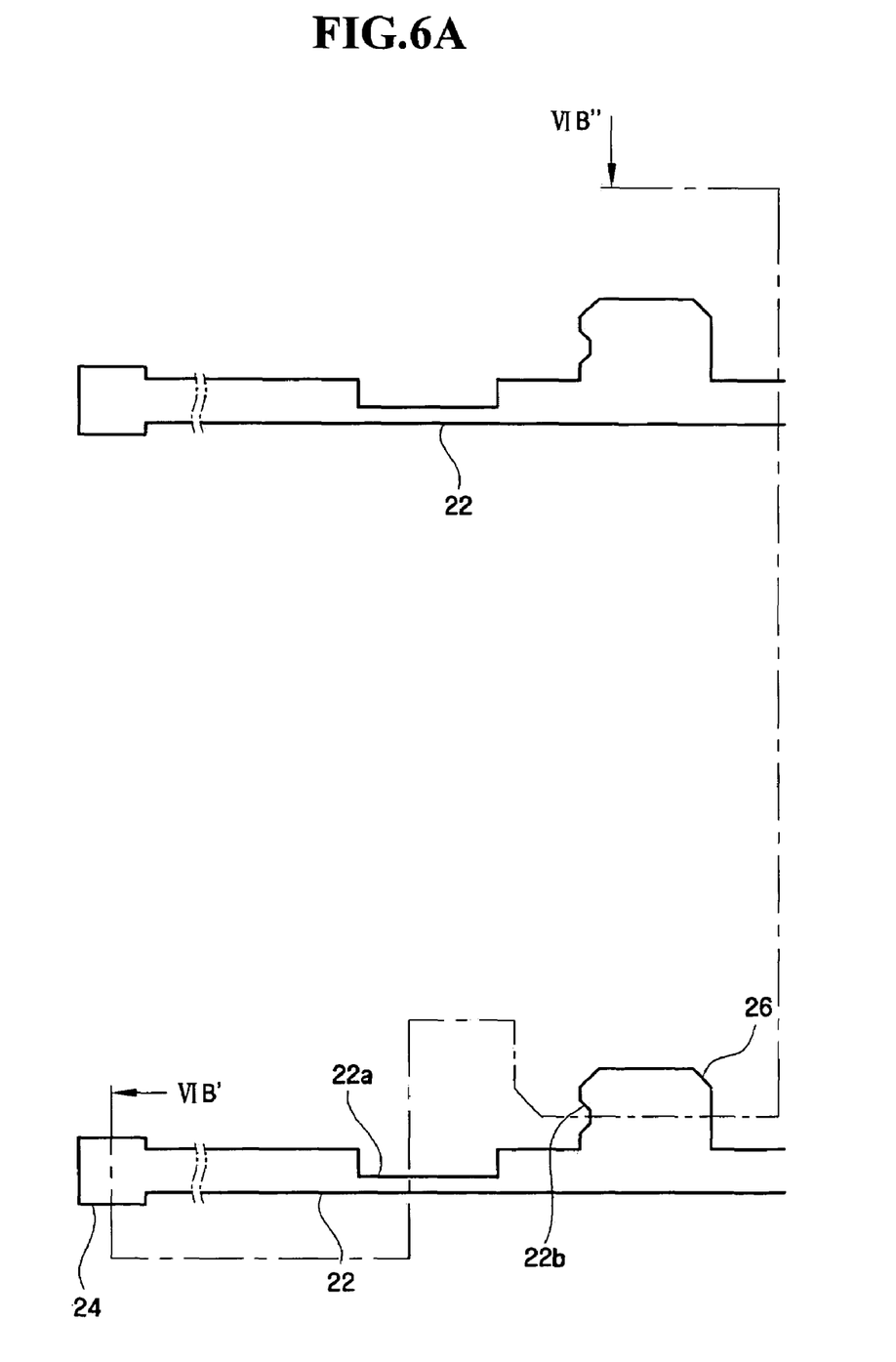
FIGS. 6A, 9A, and 11A are circuit views sequentially showing an exemplary method for fabricating an exemplary TFT panel according to an exemplary embodiment of the present invention.
Figure 9A:
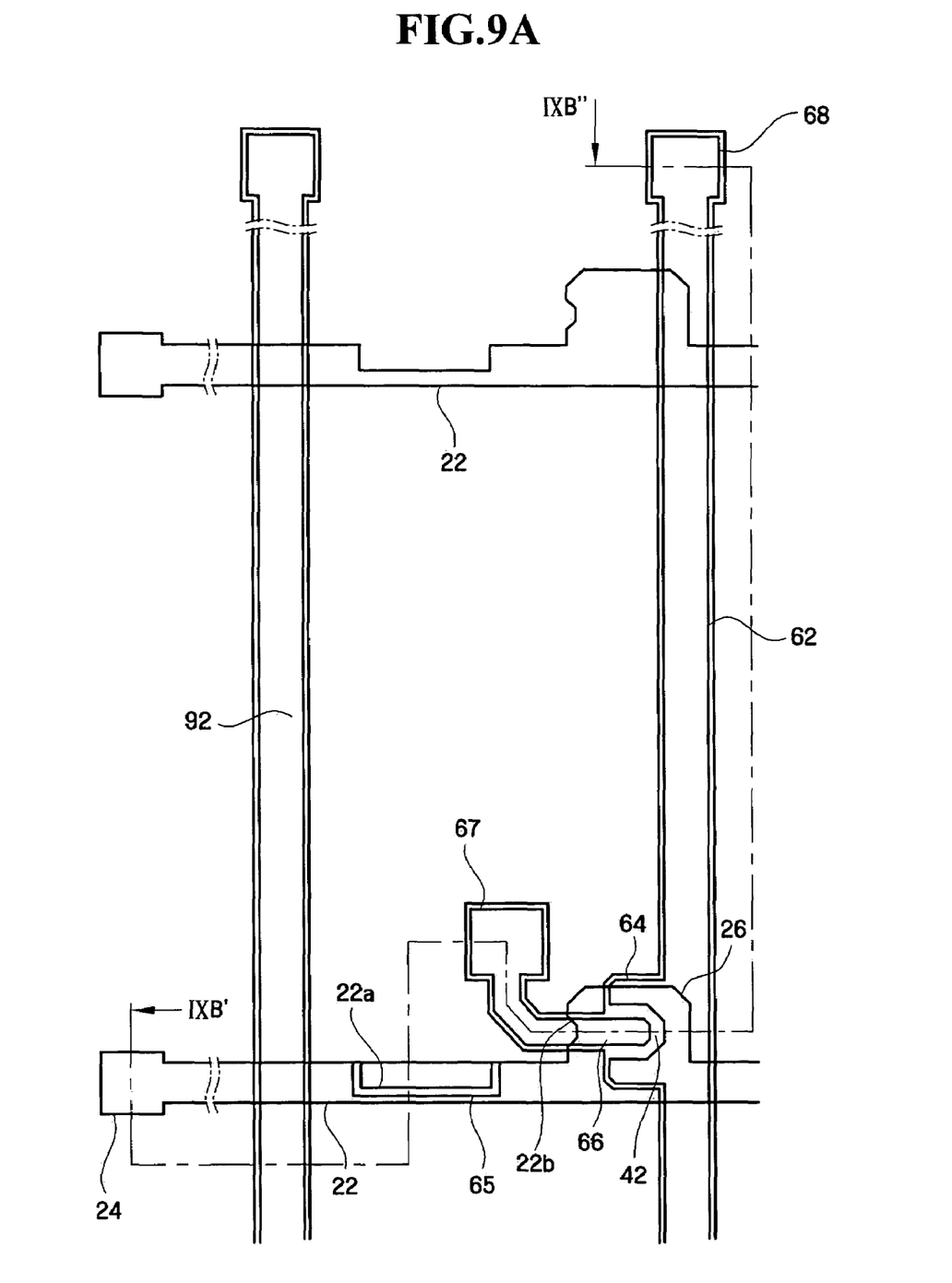
Figure 11A:
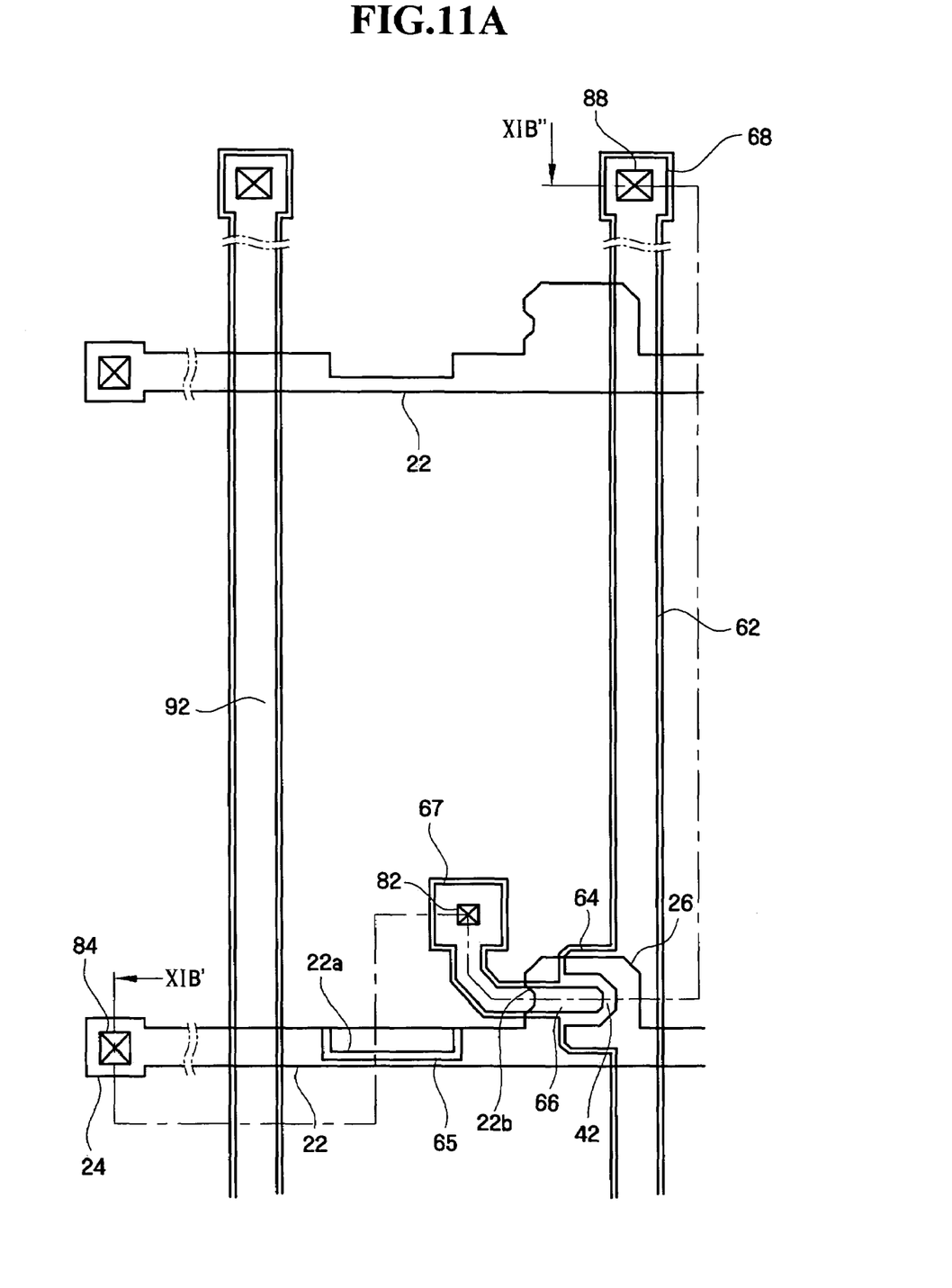

FIGS. 6A, 9A, and 11A are circuit views sequentially showing an exemplary method for fabricating an exemplary TFT panel according to an exemplary embodiment of the present invention.

Figure 6B:
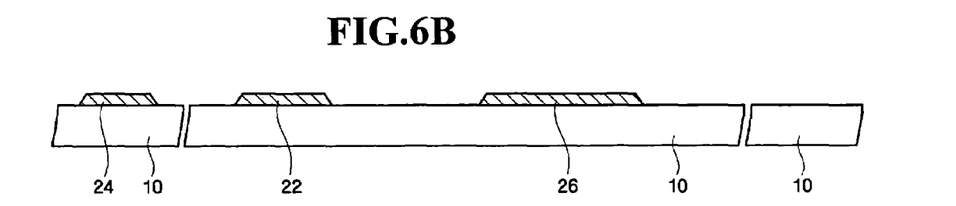
Figure 7:
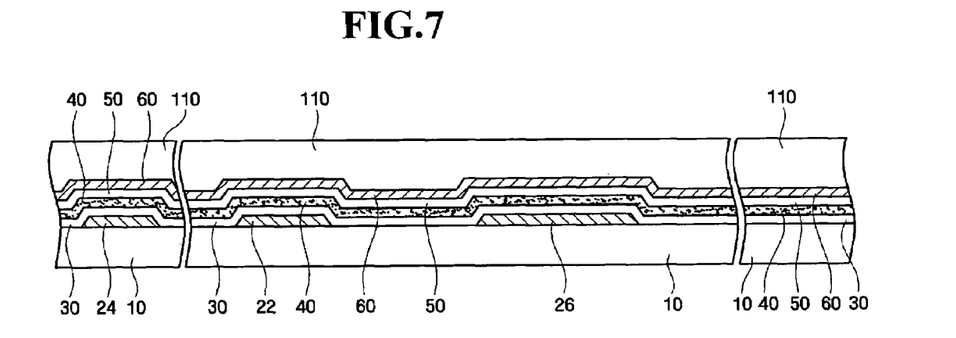
Figure 8:
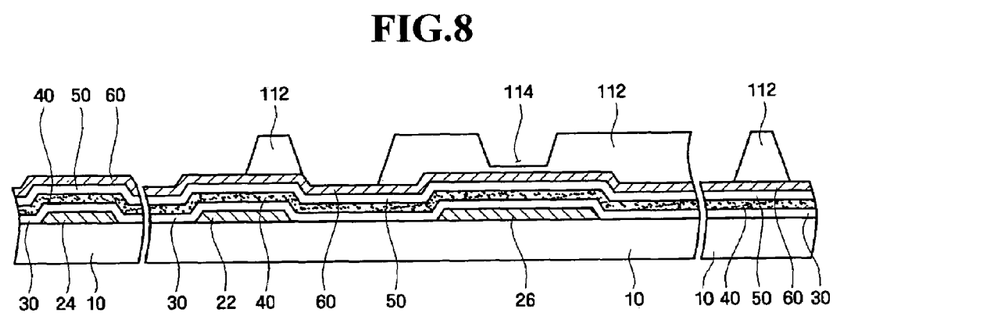
Figure 9B:
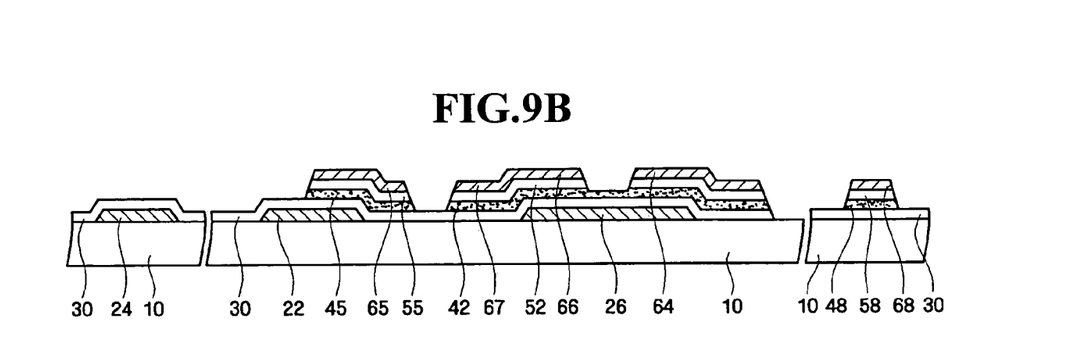
FIGS. 9B and 10 are sectional views showing exemplary processing steps, taken along line IXB'-IXB" of FIG. 9A.
Figure 10:
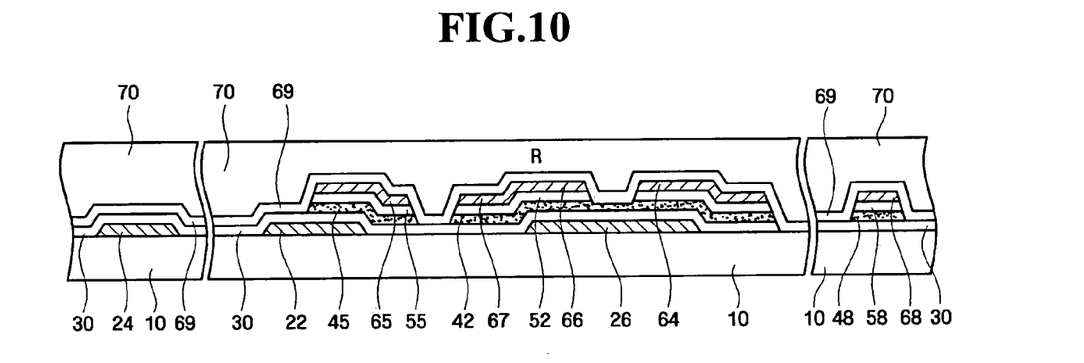
Figure 11B:
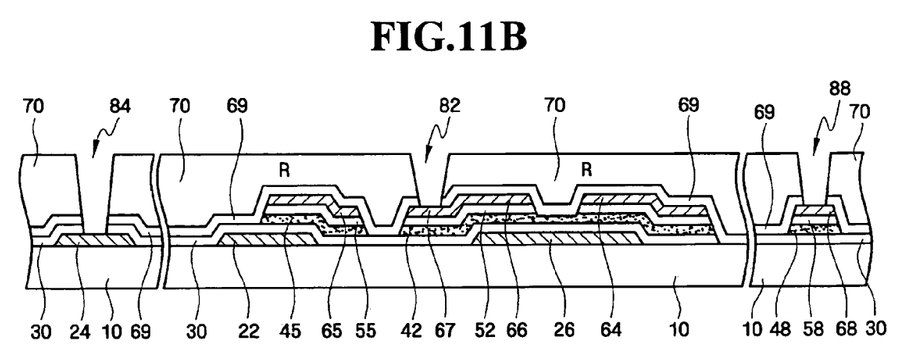
FIGS. 11B and 12 are sectional views showing exemplary processing steps, taken along line XIB'-XIB" of FIG. 11A.
Figure 12:
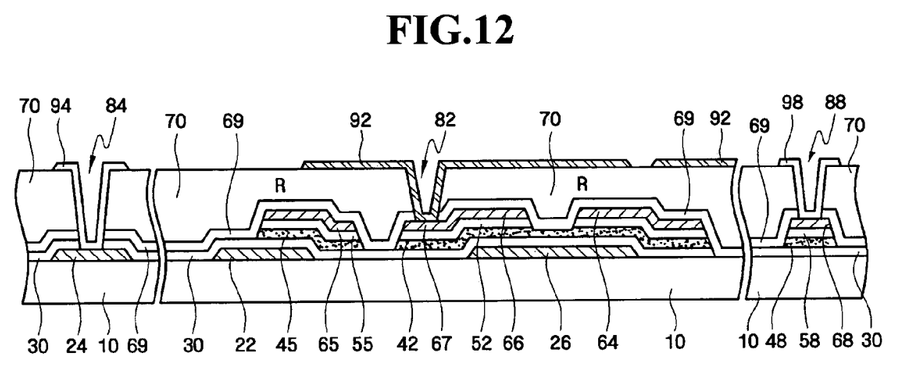

FIGS. 6B through 8 are sectional views showing exemplary processing steps, taken along line VIB'-VIB" of FIG. 6A, FIGS. 9B and 10 are sectional views showing exemplary processing steps, taken along line IXB'-IXB" of FIG. 8A, and FIGS. 11B and 12 are sectional views showing exemplary processing steps, taken along line XIB'-XIB" of FIG. 11A.

As shown in FIGS. 6A and 6B, after a washing process is performed to remove foreign substance or organic material on the insulating substrate 10 and to improve adhesion between a metal thin film made of a gate material to be deposited and the insulating substrate 10, a metal layer for a gate interconnection line is formed through sputtering on the insulating substrate 10. At this time, the metal layer for a gate interconnection line is preferably made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta.

In addition, the metal layer for a gate interconnection line preferably has a multi-layered structure including two conductive films (not shown) having different physical characteristics. One of the two films in such a multi-layered structure is preferably made of a low resistivity metal including Al containing metal, Ag containing metal, and Cu containing metal for reducing a signal delay or a voltage drop in the gate interconnection line, and the other film is preferably made of material such as a Mo containing metal, Cr, Ta or Ti, which have good physical, chemical, and electrical contact characteristics with other materials such as ITO or IZO. Examples of combinations of the two films include a lower Cr film and an upper Al (alloy) film and a lower Al (alloy) film and an upper Mo (alloy) film. While particular embodiments of materials are described, the gate interconnection line 22, 24, 26 may be made of various metals or conductors.

Next, a photoresist layer pattern (not shown) is formed on the metal layer and the gate interconnection line 22, 24, 26 is formed using the photoresist layer pattern as an etching mask.

Here, reference numeral 22 denotes a gate line, reference numeral 24 denotes a gate line pad, and reference numeral 26 denotes a gate electrode. When the gate interconnection line 22, 24 and 26 are formed, a first recess 22a having a first length in the first direction and a first width extending in the second direction, and a second recess 22b having a second width are formed in the gate line 22 and the gate electrode 26, respectively. As illustrated, the first recess 22a may be formed in the gate line 22 to face the pixel region to which the gate electrode 26 is associated. In other words, the gate line 22, which extends in the first direction, has a width measured in the second direction, where the width of the gate line 22 at the first recess 22a is less than a width of a remainder of the gate line 22. Here, an end portion of the second recess 22b is formed to be aligned with an end portion of a channel region formed under the drain electrode 66. That is, the channel region and the second recess 22b are aligned along the first direction, and may each be spaced from the gate line by substantially a same distance. As illustrated, the second recess 22b may be disposed under the bar-type end of the drain electrode 66, and may face away from a data line 62 from which the source electrode 64 is extended. The gate electrode 26 may have a width measured in the second direction, wherein the width of the gate electrode 26 at the second recess 22b is less than a width of the portion of the gate electrode 26 directly adjacent the gate line 22. The first width of the first recess 22a is in a range of 9-11 μm and the second width of the second recess 22b is in a range of 3-5 μm.

Next, as shown in FIG. 7, the gate insulating layer 30, an amorphous silicon (a-Si:H) layer 40, and an amorphous silicon (a-Si:H) layer 50 doped with n-type impurity are continuously deposited through plasma enhanced chemical vapor deposition ("PECVD") on a resultant structure including the gate interconnection line 22, 24, 26 on the resultant substrate. Here, the gate insulating layer 30 is formed of silicon nitride (SiNx) or silicon oxide ($SiO_2$). At this time, the a-Si layer 50 doped with n-type impurity is formed for the purpose of reducing a contact resistance between a metal layer 60 for a data interconnection line which will later be formed and the a-Si layer 40.

Next, after depositing the metal layer 60 for a data interconnection line, a drain electrode, and a light blocking layer on the a-Si layer 50 doped with n-type impurity, a photoresist layer 110 is coated on the metal layer 60. Here, the metal layer 60 is preferably made of a refractory metal such as Cr, Mo, Ti, Ta or alloys thereof. In an exemplary embodiment, the metal layer 60 for a data interconnection line may have a multilayered structure including a low-resistivity film (not shown) and a good-contact film (not shown). Examples of the multi-layered structure include a double-layered structure having a lower Cr film and an upper Al (alloy) film, a double-layered structure having a lower Al (alloy) film and an upper Mo (alloy) film, and a triple-layered structure having a lower Mo film, an intermediate Al film, and an upper Mo film. While particular exemplary embodiments are described, it should be understood that the metal layer 60 may be made of various metals or conductors.

Next, as shown in FIG. 8, light is radiated on the photoresist layer 110 through a mask and then development is performed to form a photoresist layer pattern 112, 114.

A first portion 114 of the photoresist layer pattern 112, 114 is positioned at the channel portion of the TFT, i.e., corresponding to a position between the source electrode 64 and the drain electrode 66. The first portion 114 is thinner than a second portion 112 of the photoresist layer pattern 112, 114, which is positioned at a data interconnection line portion, a drain electrode portion, and a light blocking layer portion where the data interconnection line, drain electrode, and light blocking layer are to be formed. The photoresist layer 110 is removed except for the areas corresponding to the channel portion and the data interconnection line portion, drain electrode portion, and light blocking layer portion. Here, a ratio of the thickness of the first portion 114 of the photoresist layer pattern remaining at the channel portion to the thickness of the second portion 112 of the photoresist layer pattern remaining at the data interconnection line portion is different according to etching conditions. The thickness of the first portion 114 may be smaller than half of the thickness of the second portion 112, for example, it may be smaller than 4000 Å.

There may be various methods of forming a photoresist layer with different thicknesses. To adjust the amount of transmitted light, usually, a slit- or grating-shape pattern is formed or a semitransparent layer is used.

Here, a line width of a pattern positioned between each of the slits or an interval between patterns, that is, a slit width, is preferably smaller than a resolution of an exposure system used in exposure. When a semitransparent layer is used, different thin films may be employed to manufacture a mask having an adjustable transmittance.

When light is radiated on the photoresist layer through such a mask, polymers are completely decomposed at a portion directly exposed to the light but are not completely decomposed at a portion where the slit pattern or the semitransparent layer is formed since the amount of radiated light is small and are rarely decomposed at a portion shielded with a shade.

Next, when the photoresist layer is developed, only the portion where the polymers are not decomposed remains, and a central portion, on which a small amount of light is radiated, is thinner than a portion on which light is not radiated at all. Here, an exposure time should not be so long to decompose all polymers.

The photoresist layer having a thin thickness may be formed by using a photoresist layer made of a reflowable material, exposing the photoresist layer through a typical mask divided into a portion through which light can completely penetrate and a portion through which light cannot completely penetrate and developing and reflowing the photoresist layer to cause a portion of the photosensitive material to flow in a portion where the photoresist layer does not remain.

Next, as shown in FIGS. 9A and 9B, the exposed metal layer 60 of the remaining portion except for the channel portion, the data interconnection line portion, and a portion over the gate line, the a-Si layer 50 doped with n-type impurity, and the a-Si layer 40 under the a-Si layer 50 are removed together with the first portion 114 of the photoresist layer. At this time, etching is performed in such a way to simultaneously etch the photoresist layer pattern 112, 114, the a-Si layer 50 doped with impurity, and the a-Si layer 40 and not to etch the gate insulating layer 30. In particular, it is preferable that etching be performed in a condition such that the etching rate of the photoresist layer pattern 112, 114 is nearly the same as that of the a-Si layer 40. For example, the photoresist layer pattern 112, 114 and the a-Si layer 40 can be etched to nearly the same thickness using a mixture of $SF_6$ and HCl or $SF_6$ and $O_2$. When the etching rate of the photoresist layer pattern 112, 114 and the etching rate of the a-Si layer 40 are the same or at least substantially the same, the thickness of the first portion 114 should be equal to or smaller than a sum of thicknesses of the a-Si layer 40 and the a-Si layer 50 doped with impurity. Thus, as shown in FIG. 9B, the first portion 114 of the channel portion is removed, thereby exposing the metal layer 60 for a data interconnection line, and the a-Si layer 50 doped with impurity and the a-Si layer 40 of the remaining portion are removed, thereby exposing the gate insulating layer 30. The second portion 112 of the data interconnection line portion is also etched and thus its thickness is reduced.

Next, the photoresist layer remaining on the surface of the metal layer 60 for the data interconnection line portion, including the drain electrode portion, and the light blocking layer portion is removed by ashing.

As shown in FIG. 9B, after portions of the metal layer 60 for defining perimeters of a data interconnection line are removed by etching, the a-Si layer 50 doped with impurity is etched by dry etching. An etching gas may be a mixture of $CF_4$ and HCl or $CF_4$ and $O_2$. When $CF_4$ and $O_2$ are used, the semiconductor layer 42 made of the a-Si layer may remain to a uniform thickness. A portion of the semiconductor layer 42 is removed and thus its thickness may be reduced, and the second portion 112 may also be etched to a predetermined thickness. At this time, etching should be performed in a condition such that the gate insulating layer 30 is not etched. In addition, it is preferable that the photoresist layer pattern 112, 114 be thick enough to prevent the data interconnection line 62, 64, 68, the drain electrode 66, 67, and the light blocking layer 65 under the photoresist layer pattern 112, 114 from being exposed by etching of the second portion 112.

Thus, the source electrode 64 and the drain electrode 66 are separated and the data interconnection line and the ohmic contact layers 52 and 55, as well as portion 58, under the data interconnection line are formed. At this time, the light blocking layer 65 is formed on the first recess 22a of the gate line 22 when the data interconnection lines including the source electrode 64 and the drain electrode 66 are formed. The light blocking layer 65 is formed of the same material and to the same thickness as the source electrode 64 and the drain electrode 66 and is formed in an island shape to prevent light leakage from occurring due to the first recess 22a formed in the gate line 22. The light blocking layer 65 also has a floating state in which a voltage is not applied. The light blocking layer 65 may overlap the ohmic contact layer 55 and the portion 45 of the semiconductor material, which are also disposed over the first recess 22a.

After the second portion 112 of the photoresist layer pattern 112, 114 remaining on the resultant structure is removed, the passivation layer 69 is formed on the resultant structure as shown in FIG. 10. Here, the passivation layer 69 is preferably made of an inorganic insulator such as silicon nitride or silicon oxide, or a low dielectric insulating material such as a-Si:C:O and a-Si:O:F formed by plasma enhanced chemical vapor deposition ("PECVD").

A dielectric layer 70 is formed on the passivation layer 69. Here, the dielectric layer 70 may be made of an organic layer and photosensitive color resin of R, G and B. At this time, a color filter made of R, G, and B may be formed on a substrate where a TFT is formed, through a photolithography process. The color filter may be formed by dispensing a color resin ink of a dye type in positions corresponding to R, G, and B of the color filter on the substrate. The color filter may also be formed by printing R, G, and B on the substrate where the TFT is formed, through screen printing.

Next, as shown in FIGS. 11A and 11B, photolithography is performed on the color filter layer 70, passivation layer 69, and the gate insulating layer 30, thereby forming the contact holes 82, 84, and 88 exposing the drain electrode extension portion 67, the gate line pad 24, and the data line pad 68.

Finally, as shown in FIG. 12, an ITO layer is deposited to a thickness of 400-500 Å and photolithography is performed on the ITO layer, thereby forming the pixel electrode 92 connected to the drain electrode extension portion 67, the auxiliary gate line pad 94 connected to the gate line pad 24, and the auxiliary data line pad 98 connected to the data line pad 68. While an ITO layer is described, other materials may alternatively be employed as previously described.

Meanwhile, it is preferable that a nitrogen gas is used for a pre-heating process prior to deposition of the ITO layer to prevent a metal oxide layer from being formed on the metal layers 24, 67, and 68 exposed through the contact holes 82, 84, and 88.

A method of improving a display of an LCD is thus made possible by excluding a storage electrode from the TFT panel to increase an aperture ratio of the LCD and reducing a parasitic capacitance between the gate electrode and the source electrode to reduce an amount of a kickback voltage due to absence of the storage electrode. Reducing the parasitic capacitance between the gate electrode and the source electrode may include providing a first recess in the gate line, reducing a width of a portion of the gate line in a pixel region defined by the gate line and the data line, and by providing a second recess in the gate electrode, an end portion of the drain electrode overlapping the second recess in the gate electrode.

As described above, according to exemplary embodiments of the present invention, the critical dimension ("CD") of a gate interconnection line can be reduced and the aperture ratio of an LCD can be improved, thereby enhancing the luminance of the LCD.

Moreover, recess are formed in a gate line and a gate electrode in a gate interconnection line to thus reduce a parasitic capacitance between the gate electrode and a source electrode, thereby reducing an amount of a kickback voltage due to the absence of the storage capacitor and improving the aperture ratio of the LCD, ultimately enhancing the luminance of the LCD.

Although the present invention has been described in connection with exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A liquid crystal display (LCD) comprising:
   a first panel comprising:
     an insulating substrate;
     a gate interconnection line formed on the insulating substrate and including a gate line and the gate electrode branched from the gate line, the gate line extending in a first direction;
     a data interconnection line including a data line, a source electrode as a branch of the data line, and a drain electrode formed spaced apart from the source electrode, the data line electrode extending in a second direction to intersect the gate line;
     a semiconductor layer formed on the gate electrode and having a channel region between the source electrode and the drain electrode; and
     a pixel electrode formed for a pixel region defined by the gate interconnection line and the data interconnection line;
   a second panel facing the first panel, and
   a liquid crystal layer interposed between the first and second panels,
   wherein the gate line includes a first recess having a first length in the first direction and a first width extending in the second direction.

2. The LCD of claim 1, further comprising the dielectric layer interposed between the pixel electrode and the source and the drain electrode.

3. The LCD of claim 2, wherein the dielectric layer is made of an organic layer.

4. The LCD of claim 2, wherein the dielectric layer is made of color resin.

5. The LCD of claim 1, wherein the first recess of the gate line faces the pixel region.

6. The LCD of claim 1, wherein the length of the first recess is greater than the width of the first recess.

7. The LCD of claim 1, wherein the length of the first recess is approximately 30-70% of a width of the pixel region.

8. The LCD of claim 1, wherein the gate electrode has a second recess having a second width under the drain electrode.

9. The LCD of claim 8, wherein a bar-type end portion of the drain electrode overlaps the second recess of the gate electrode.

10. The LCD of claim 8, wherein the second recess of the gate electrode faces away from the data line.

11. The LCD of claim 8, wherein an end portion of the second recess is aligned with an end portion of the channel region.

12. The LCD of claim 11, wherein a central portion of the second recess and a central portion of the channel region are aligned with a longitudinal axis of an end portion of the drain electrode.

13. The LCD of claim 12, wherein the longitudinal axis of the end portion of the drain electrode is substantially parallel to the first direction.

14. The LCD of claim 8, wherein the second width is in a range of 3-5 µm.

15. The LCD of claim 1, further comprising a light blocking layer covering the first recess.

16. The LCD of claim 15, wherein the light blocking layer has a width of approximately 30-70% of that of a pixel region.

17. The LCD of claim 15, wherein the light blocking layer is in a floating state in which no voltage is applied.

18. The LCD panel of claim 15, wherein the light blocking layer is made of a same material as the source electrode and the drain electrode.

19. The LCD of claim 15, wherein the light blocking layer is made in a same layer as the data interconnection line.

20. The LCD of claim 1, wherein the first width is in a range of 9-11 µm.

21. The LCD of claim 1, wherein a dielectric constant of the liquid crystal layer is in a range of 3-5 in a normally white mode.

22. The LCD of claim 1, wherein a dielectric constant of the liquid crystal layer is in a range of 13-15 in a normally black mode.

* * * * *